United States Patent
Kim et al.

(10) Patent No.: US 11,417,613 B2
(45) Date of Patent: Aug. 16, 2022

(54) SEMICONDUCTOR PACKAGE

(71) Applicant: SAMSUNG ELECTRONICS CO., LTD., Suwon-si (KR)

(72) Inventors: Jingu Kim, Suwon-si (KR); Shanghoon Seo, Asan-si (KR); Sangkyu Lee, Suwon-si (KR); Jeongho Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 42 days.

(21) Appl. No.: 17/016,123

(22) Filed: Sep. 9, 2020

(65) Prior Publication Data

US 2021/0272913 A1    Sep. 2, 2021

(30) Foreign Application Priority Data

Mar. 2, 2020    (KR) .................. 10-2020-0025982

(51) Int. Cl.
*H01L 21/56* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC .............. H01L 23/562; H01L 21/4853; H01L 21/4857; H01L 21/565; H01L 21/568;
(Continued)

(56) References Cited

U.S. PATENT DOCUMENTS 7,957,154 B2 *   6/2011   Ito .................... H01L 23/5389
                                                  361/765
8,564,116 B2 *  10/2013  Yamano ................ H01L 24/97
                                                  257/698
(Continued)

FOREIGN PATENT DOCUMENTS

JP          4123693 B2      7/2008
KR    10-2015-0030134 A     3/2015

*Primary Examiner* — Fernando L Toledo
*Assistant Examiner* — Neil R Prasad
(74) *Attorney, Agent, or Firm* — Volentine, Whitt & Francos, PLLC

(57) ABSTRACT

A semiconductor package includes: a frame substrate having a plurality of wiring layers and a cavity; an adhesive member disposed at the bottom of the cavity; a semiconductor chip disposed in the cavity, with a connection pad on an upper surface and the lower surface in contact with the adhesive member; a first conductive bump disposed on the connection pad; a second conductive bump disposed on the uppermost of the plurality of wiring layers; an insulating post disposed in the cavity and whose lower surface contacts the adhesive member; an encapsulant filling the cavity and covering side surfaces of the first and second conductive bumps and the insulating post' and a redistribution structure disposed on the encapsulant, including a redistribution layer electrically connected to the first and second conductive bumps, wherein the insulating post includes a material having a greater hardness than that of the first and second conductive bumps.

20 Claims, 18 Drawing Sheets

(51) Int. Cl.
  *H01L 23/538* (2006.01)
  *H01L 21/683* (2006.01)
  *H01L 21/48* (2006.01)
  *H01L 23/31* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68372* (2013.01); *H01L 2224/214* (2013.01); *H01L 2924/3511* (2013.01)

(58) Field of Classification Search
  CPC ............. H01L 21/6835; H01L 23/3128; H01L 23/5383; H01L 23/5386; H01L 23/5389; H01L 24/19; H01L 24/20; H01L 2221/68372; H01L 2224/214; H01L 2924/3511
  See application file for complete search history.

(56) References Cited

U.S. PATENT DOCUMENTS

| | | | |
|---|---|---|---|
| 9,524,956 B2 | 12/2016 | Pei et al. | |
| 9,627,288 B2 | 4/2017 | Chen et al. | |
| 9,786,586 B1 | 10/2017 | Shih | |
| 9,972,580 B2 | 5/2018 | Kwon et al. | |
| 2013/0200528 A1* | 8/2013 | Lin | H01L 23/3157 257/774 |
| 2015/0069623 A1 | 3/2015 | Tsai et al. | |
| 2019/0198429 A1 | 6/2019 | Kang et al. | |
| 2020/0111732 A1* | 4/2020 | Kanbe | H01L 23/49822 |
| 2020/0388600 A1* | 12/2020 | Huang | H01L 23/3128 |
| 2021/0249367 A1* | 8/2021 | Hsieh | H01L 24/10 |

* cited by examiner

II-II'

SEMICONDUCTOR PACKAGE

CROSS-REFERENCE TO RELATED APPLICATION

This application claims benefit of priority to Korean Patent Application No. 10-2020-0025982 filed on Mar. 2, 2020 in the Korean Intellectual Property Office, the disclosure of which is incorporated herein by reference in its entirety.

BACKGROUND

Example embodiments of the present inventive concept relate to a semiconductor package.

With the trend for a reduced size of a semiconductor chip, there has been demand for reducing a thickness and a size of a semiconductor package in the field of semiconductor packaging. One such packaging technique is to redistribute connection pads of a semiconductor chip in a fan-out region by forming a redistribution layer on a semiconductor chip. However, if a surface on which a redistribution structure is disposed is not uniformly ground, reliability of a redistribution layer may degrade and a thickness of a package may not be uniform, such that it may be difficult to control warpage.

SUMMARY

Accordingly, it would be desirable to provide a semiconductor package including a redistribution layer with improved reliability, and having a uniform thickness.

According to an example embodiment of the present inventive concept, a semiconductor package includes a frame substrate including a plurality of wiring layers disposed on different levels, and having a cavity including a stopper layer disposed on a bottom surface of the cavity, an adhesive member disposed on the bottom surface of the cavity, a semiconductor chip disposed in the cavity, and having an upper surface on which a connection pad is disposed and a lower surface opposing the upper surface, where the lower surface is in contact with the adhesive member, a first conductive bump disposed on the connection pad, a second conductive bump disposed on an uppermost wiring layer of the plurality of wiring layers, an insulating post disposed in the cavity and having a lower surface in contact with the adhesive member, an encapsulant filling the cavity and covering side surfaces of the first and second conductive bumps and a side surface of the insulating post, and a redistribution structure disposed on the encapsulant and including a redistribution layer electrically connected to the first and second conductive bumps, wherein the insulating post includes a material having higher hardness than that of the first and second conductive bumps.

According to another example embodiment of the present inventive concept, a semiconductor package includes a frame substrate including a plurality of wiring layers disposed on different levels, and having a cavity, a semiconductor chip disposed in the cavity, and having an upper surface on which a connection pad is disposed and a lower surface opposing the upper surface, where the lower surface is directed to a lower side of the cavity, a plurality of conductive bumps disposed on an uppermost wiring layer of the plurality of wiring layers and the connection pad, respectively, an insulating post disposed on the frame substrate and spaced apart from the plurality of conductive bumps, an encapsulant filling the cavity and covering side surfaces of the plurality of conductive bumps and a side surface of the insulating post, and a redistribution structure including an insulating layer disposed on the encapsulant and a redistribution layer disposed on the insulating layer and connected to the plurality of conductive bumps, wherein the insulating post includes a material different from a material of the plurality of conductive bumps.

According to yet another example embodiment of the present inventive concept, a semiconductor package includes a semiconductor chip having an upper surface on which a connection pad is disposed and a lower surface opposing the upper surface, and including a conductive bump disposed on the connection pad, a first redistribution structure disposed on an upper side of the semiconductor chip, and including a first redistribution layer electrically connected to the conductive bump, a second redistribution structure disposed on a lower side of the semiconductor chip, and including an insulating layer, a second redistribution layer disposed on the insulating layer, and a vertical connection conductor electrically connecting the second redistribution layer to the first redistribution layer, an insulating post disposed between the first redistribution structure and the second redistribution structure, and insulated with the first redistribution layer and the second redistribution layer, an encapsulant encapsulating at least a portion of the semiconductor chip, and covering a side surface of the conductive bump, a side surface of the vertical connection conductor, and a side surface of the insulating post, wherein the conductive bump and the vertical connection conductor include a metal material, and wherein the insulating post includes a ceramic material having higher hardness than hardness of the metal material.

According to still another example embodiment of the inventive concept, a semiconductor package having a top and a bottom, comprises: a semiconductor chip disposed within the semiconductor package between the top of the semiconductor package and the bottom of the semiconductor package, wherein the semiconductor chip has a top surface, a bottom surface, and side surfaces extending between the top surface and the bottom surface, wherein the semiconductor chip includes at least one connection pad disposed on the top surface thereof; a plurality of wiring layers stacked vertically between the top of the semiconductor package and the bottom of the semiconductor package; a first conductive bump disposed on top of the connection pad of the semiconductor chip; a second conductive bump disposed on top of an uppermost wiring layer among the plurality of wiring layers; an insulating post disposed between the top of the semiconductor package and the bottom of the semiconductor package; an encapsulant disposed at side surfaces of the first and second conductive bumps and the insulating post, and further disposed at the side surfaces of the semiconductor chip and at least a portion of the top surface of the semiconductor chip; and a redistribution structure disposed on top of the encapsulant, wherein the redistribution structure includes a redistribution layer electrically connected to the first and second conductive bumps, wherein a top surface of the insulating post is substantially coplanar with: a top surface of the first conductive bump, a top surface of the second conductive post, and a top surface of the encapsulant, and wherein the insulating post is made of a material having a greater hardness than a first material of the first conductive bump and a second material of the second conductive bump.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings. In the description and claims to follow, when surfaces are said to be substantially coplanar, this means that they are coplanar except for any deviations due to manufacturing tolerances for the device.

Figure 1:
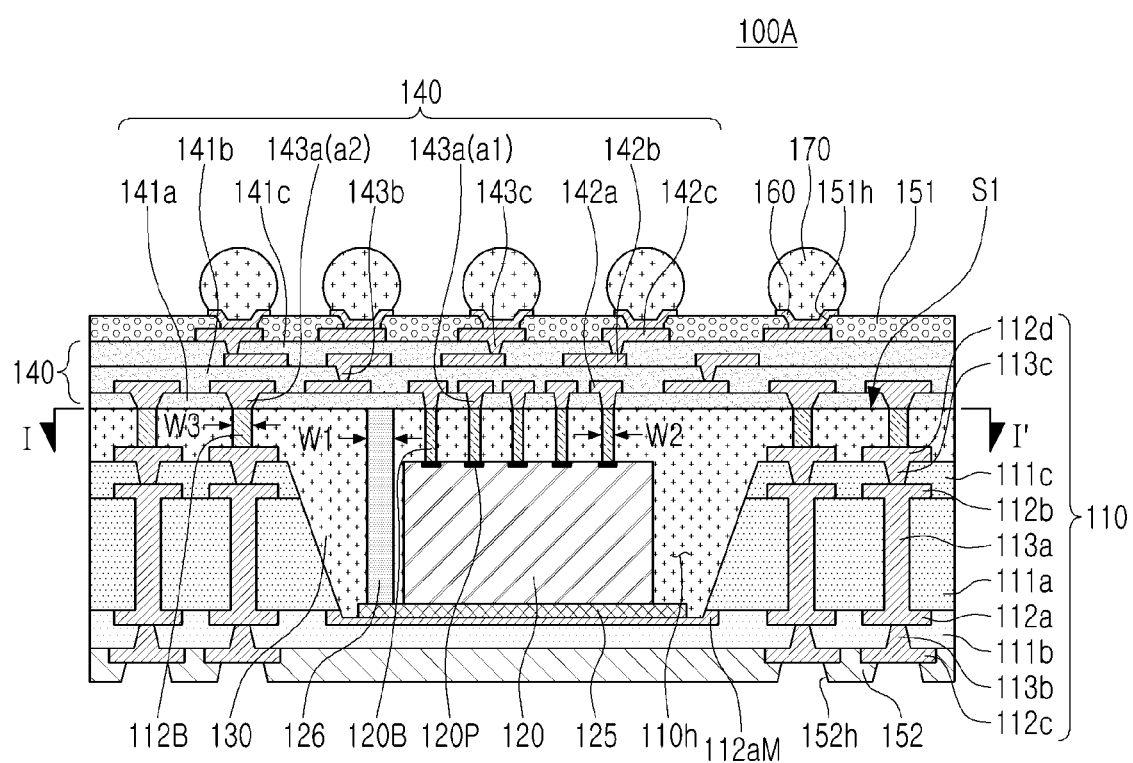
FIG. 1 is a cross-sectional diagram illustrating a semiconductor package according to an example embodiment of the present disclosure.
Figure 2A:
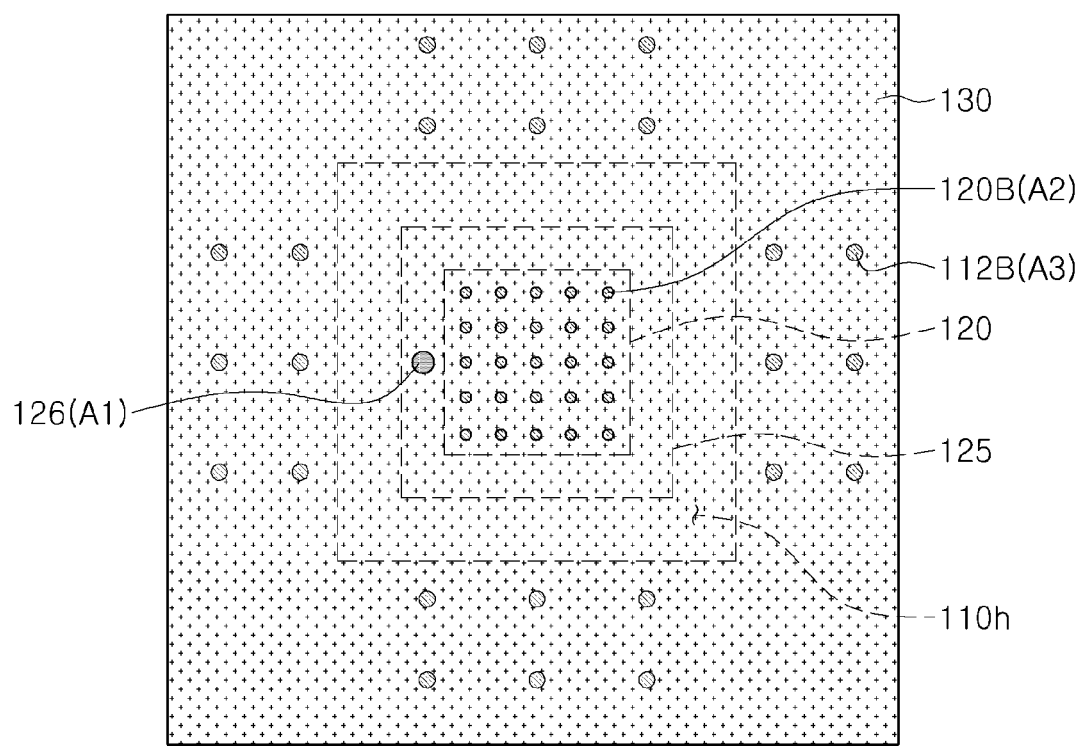
FIG. 2A is a plan diagram illustrating a cross-sectional surface of the semiconductor package illustrated in FIG. 1 along line I-I'.
Figure 2B:
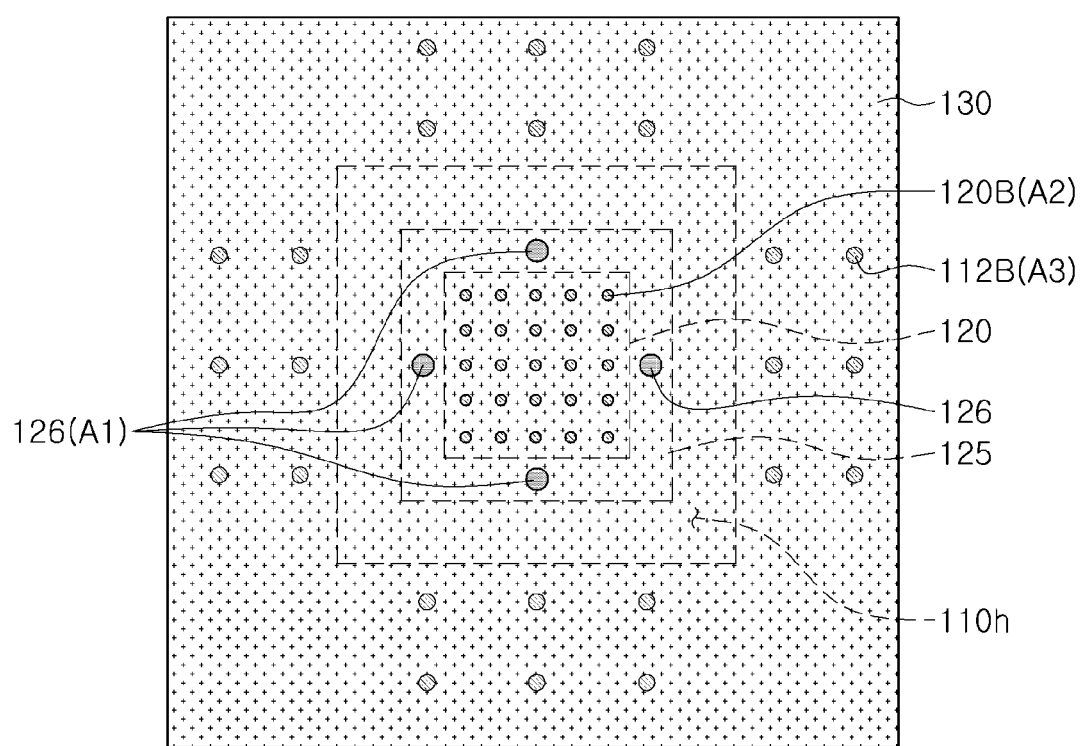
FIG. 2B and FIG. 2C are plan diagrams illustrating a modified dispositional structure of an insulating post illustrated in FIG. 2A.
Figure 2C:
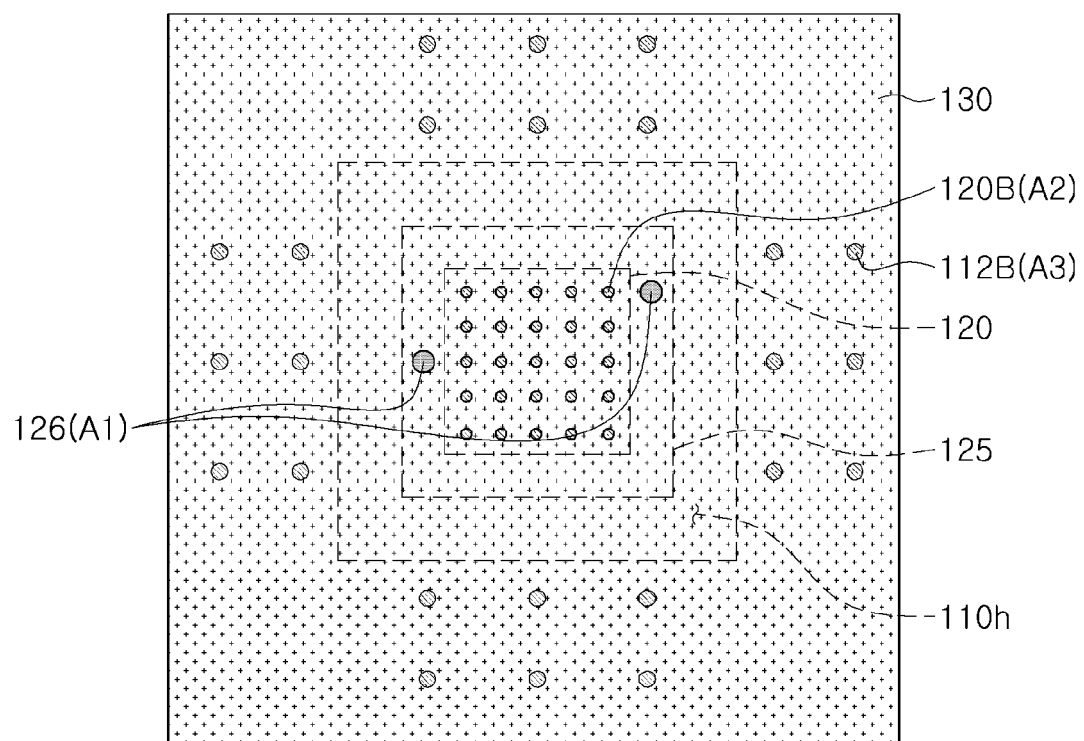
Figure 3A:
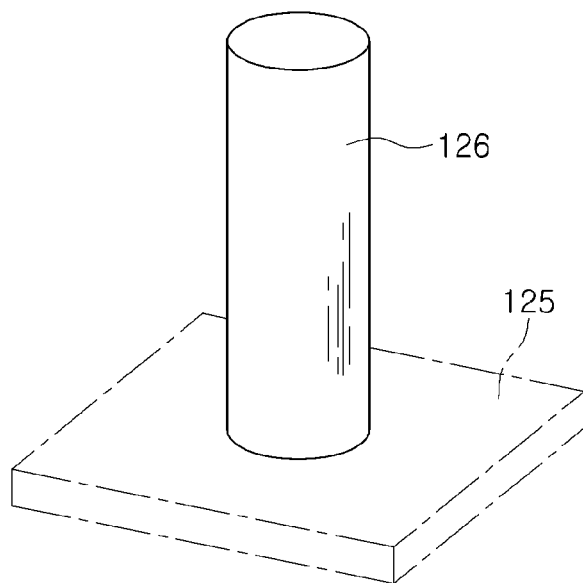
FIGS. 3A, 3B, 3C, 3D and 3E are perspective diagrams illustrating a shape of an insulating post according to one or more example embodiments.
Figure 3B:
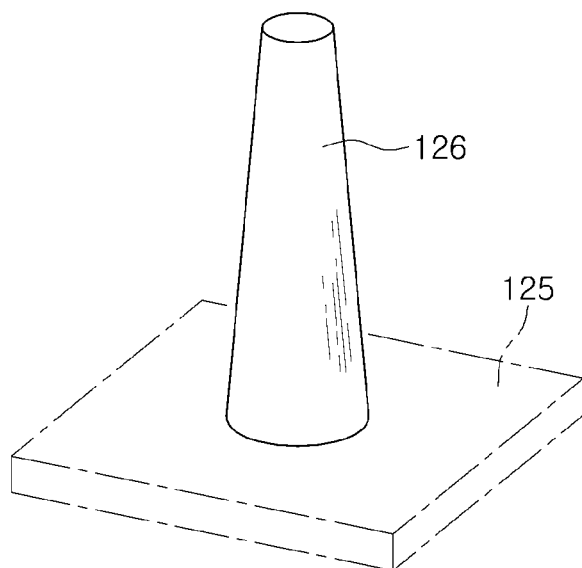
Figure 3C:
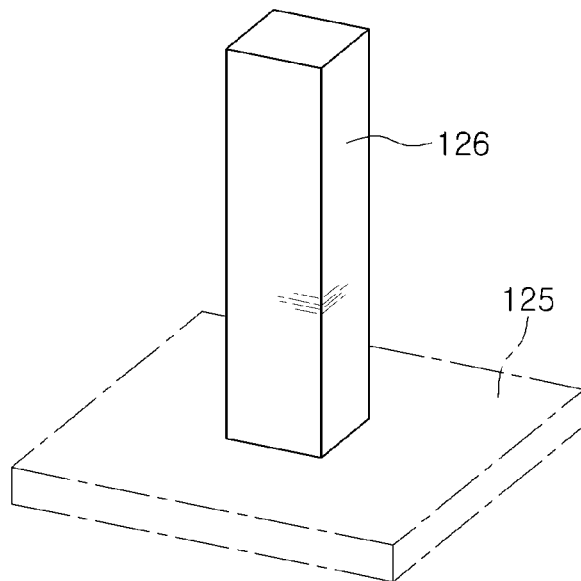
Figure 3D:
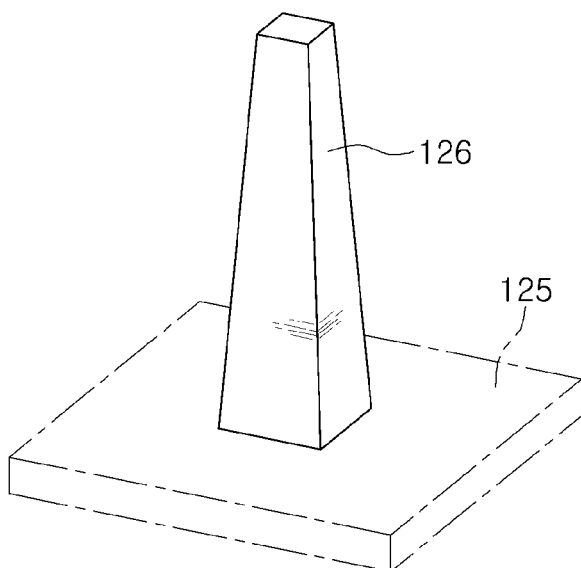
Figure 3E:
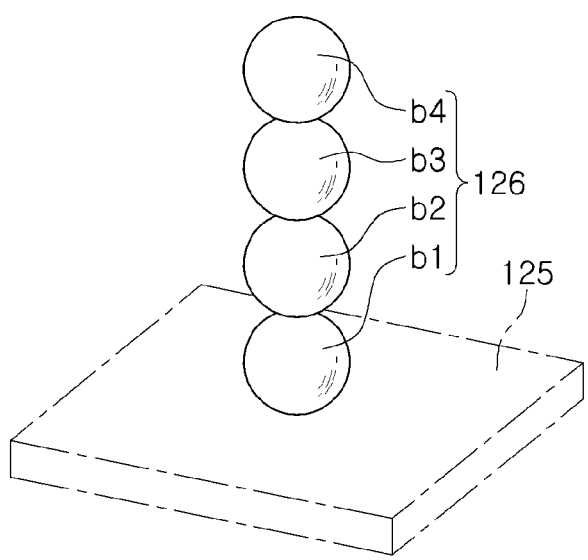

FIG. 1 is a cross-sectional diagram illustrating a semiconductor package 100A according to an example embodiment. FIG. 2A is a plan diagram illustrating a cross-sectional surface of semiconductor package 100A illustrated in FIG. 1 along line I-I'. FIGS. 2B and 2C are plan diagrams illustrating a modified dispositional structure of an insulating post 126 illustrated in FIG. 2A. FIGS. 3A, 3B, 3C, 3D and 3E are perspective diagrams illustrating a shape of insulating post 126 according to one or more example embodiments.

Referring to FIGS. 1 and 2A, a semiconductor package 100A in the example embodiment may include a frame substrate 110, an adhesive member 125, a semiconductor chip 120, a plurality of conductive bumps 120B and 112B, an insulating post 126, an encapsulant 130, and a redistribution structure 140. Insulating post 126 may include a material having a greater hardness than that of the plurality of conductive bumps 120B and 112B.

Frame substrate 110 may include one or more insulating layers 111a, 111b, and 111c, a plurality of wiring layers 112a, 112b, 112c, and 112d disposed on different levels, and a plurality of wiring vias 113a, 113b, and 113c electrically connecting the plurality of wiring layers 112a, 112b, 112c, and 112d to each other, and may have a cavity 110h including a stopper layer 112aM disposed on a bottom surface of cavity 110h. Cavity 110h may penetrate at least a portion of frame substrate 110. The numbers of each of the insulating layers, the wiring layers, and the wiring vias may be greater than the examples illustrated in the diagram. Herein, a first level is referred to as a lower level than a second level when the first level is further from the top of semiconductor package 100A (and therefore closer to the bottom of semiconductor package 100A) than the second level. For example, in semiconductor package 100A of FIG. 1, first passivation layer 151 is disposed at the top of semiconductor package 100A and second passivation layer 152 is disposed at the bottom of semiconductor package 100A.

For example, frame substrate 110 may include a core insulating layer 111a, a first insulating layer 111b disposed on a lower side of core insulating layer 111a, and a second insulating layer 111c disposed on an upper side of core insulating layer 111a, and may include a first wiring layer 112a disposed on a lower surface of core insulating layer 111a, a second wiring layer 112b disposed on an upper surface of core insulating layer 111a, a third wiring layer 112c disposed on a lower surface of first insulating layer 111b, and a fourth wiring layer 112d disposed on an upper surface of second wiring layer 112b. cavity 110h may penetrate second insulating layer 111c and core insulating layer 111a, and first insulating layer 111b may cover a lower surface of stopper layer 112aM disposed on the bottom surface of cavity 110h. Accordingly, third wiring layer 112c may be disposed on a level lower than a level of stopper layer 112aM, and first wiring layer 112a may be disposed on the same level as stopper layer 112aM.

Frame substrate 110 may improve the stiffness of semiconductor package 100A and the uniformity of the thickness of encapsulant 130. Also, as frame substrate 110 includes the plurality of wiring layers 112a, 112b, 112c, and 112d and wiring vias 113a, 113b, and 113c, frame substrate 110 may provide an electrical connection path penetrating semiconductor package 100A upwardly and downwardly. Also, as frame substrate 110 includes a lowermost wiring layer 112c of the plurality of wiring layers 112a, 112b, 112c, and 112d, semiconductor package 100A having a dual-surface redistribution structure may be provided without a process of forming a wiring layer on a rear surface of semiconductor chip 120.

Insulating layers 111a, 111b, and 111c may include an insulating material. The insulating material may include a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, Ajinomoto build-up film (ABF), FR-4, bismaleimide triazine (BT), or the like. As a material having high stiffness, such as prepreg, is included, warpage of semiconductor package 100A may be effectively controlled.

Core insulating layer 111a may have a thickness greater than thicknesses of first insulating layer 111b and second insulating layer 111c to maintain stiffness. By including first insulating layer 111b and second insulating layer 111c, a greater number of wiring layers 112c and 112d may be formed. For example, core insulating layer 111a may be formed using a single-surface or dual-surface copper clad laminate (CCL), and first insulating layer 111b and second insulating layer 111c may be formed on the copper clad laminate using prepreg or an ABF. First insulating layer 111b and second insulating layer 111c may be symmetrical to each other with reference to core insulating layer 111a, but a form of frame substrate 110 is not limited thereto.

Wiring layers 112a, 112b, 112c, and 112d may be electrically connected to each other, and may be electrically connected to a connection pad 120P of semiconductor chip 120. Wiring layers 112a, 112b, 112c, and 112d may include a metal material including copper (Cu), aluminum (Al), silver (Ag), tin (Sn), gold (Au), nickel (Ni), lead (Pb), titanium (Ti), or alloys thereof. Wiring layers 112a, 112b, 112c, and 112d may perform various functions depending on a respective design. For example, wiring layers 112a, 112b, 112c, and 112d may include a ground (GND) pattern, a power (PWR) pattern, a signal (S) pattern, and the like. The signal (S) pattern may be a transfer path of various signals such as a data signal, and the like, other than a ground (GND) pattern and a power (PWR) pattern, for example. A thickness of each of wiring layers 112a, 112b, 112c, and 112d may be greater than thicknesses of redistribution layers 142a, 142b, and 142c of redistribution structure 140.

Wiring vias 113a, 113b, and 113c may electrically connect wiring layers 112a, 112b, 112c, and 112d disposed on different levels to each other such that an electrical path may be formed in frame substrate 110. Wiring vias 113a, 113b, and 113c may also include a metal material. Wiring vias 113a, 113b, and 113c may be completely filled with a metal material or a metal material may be formed along a wall of a via hole. Wiring vias 113a, 113b, and 113c may have different shapes than each other. For example, first wiring via 113a may have a cylindrical cross-sectional surface or an hour glass shaped cross-sectional surface, and second and third wiring vias 113b and 113c may have tapered cross-sectional surfaces, tapered in opposite directions with reference to core insulating layer 111a. First wiring via 113a penetrating core insulating layer 111a may have a diameter greater than diameters of second and third wiring vias 113b and 113c penetrating first and second insulating layers 111b and 111c, respectively.

Cavity 110h may be formed by partially removing frame substrate 110, and stopper layer 112aM for adjusting a depth of cavity 110h in a process of removing frame substrate 110 may be disposed on a bottom surface of cavity 110h. The process of removing frame substrate 110 may be implemented by a sandblasting process, and in this case, a side wall of cavity 110h may have a tapered cross-sectional surface. When cavity 110h has a tapered cross-sectional surface, a yield in a process of aligning semiconductor chip 120 may increase. Cavity 110h may penetrate core insulating layer 111a and second insulating layer 111c and may not penetrate first insulating layer 111b. Stopper layer 112aM may be disposed on a lower surface of core insulating layer 111a, and the lower surface may be covered by first insulating layer 111b.

Stopper layer 112aM may include a metal material the same as or similar to those of wiring layers 112a, 112b, 112c, and 112d. Alternatively, stopper layer 112aM may include a material having an etching rate lower than that of wiring layers 112a, 112b, 112c, and 112d with respect to a sandblasting process. For example, stopper layer 112aM may include a dry film photoresist. When stopper layer 112aM is a metal layer, stopper layer 112aM may be used as a ground layer. A lower surface of stopper layer 112aM may be covered by first insulating layer 111b, and at least a portion of an upper surface of stopper layer 112aM may be exposed by cavity 110h. As a portion of stopper layer 112aM exposed in a process of forming cavity 110h may be removed, a thickness of a region of stopper layer 112aM exposed from core insulating layer 111a by cavity 110h may be less than a thickness of an edge region which is not exposed from core insulating layer 111a by cavity 110h.

An adhesive member 125 may be disposed on a bottom surface of cavity 110h, and may fasten semiconductor chip 120 and insulating post 126. Adhesive member 125 may include an adhesive resin such as a thermosetting resin. An adhesive resin may include at least one of a bisphenol epoxy resin, a novolak epoxy resin, a phenol resin, a urea resin, a melamine resin, a unsaturated polyester resin, and a resorcinol resin. Adhesive member 125 may include a die attach film (DAF).

Semiconductor chip 120 may be disposed in cavity 110h, and may have an upper surface on which connection pad 120P is disposed and a lower surface opposing the upper surface, and the lower surface may be directed to a lower side of cavity 110h. Semiconductor chip 120 may be fastened in cavity 110h by adhesive member 125, and the lower surface of semiconductor chip 120 may be directly in contact with adhesive member 125.

Semiconductor chip 120 may be configured as an integrated circuit (IC) chip formed from a wafer on which a plurality of ICs are formed. Semiconductor chip 120 may comprise a logic chip such as a central processing unit (CPU), a graphics processing unit (GPU), a field programmable gate array (FPGA), a digital signal processor, a cryptographic processor, a microprocessor, a microcontroller, an analog-digital converter, or an application-specific IC (ASIC), or a memory chip such as a volatile memory (e.g., a dynamic random access memory (DRAM)), a nonvolatile memory (e.g., a read only memory (ROM)), or a flash memory.

A plurality of conductive bumps 120B and 112B may include a first conductive bump 120B disposed on connection pad 120P of semiconductor chip 120 and a second conductive bump 112B disposed on an uppermost wiring layer 112d of the plurality of wiring layers 112a, 112b, 112c, and 112d.

First conductive bump 120B may electrically connect connection pad 120P of semiconductor chip 120 to redistribution layers 142a, 142b, and 142c of redistribution structure 140. First conductive bump 120B may include a metal material such as copper, for example. First conductive bump 120B may have a pillar shape, but the shape is not limited thereto. The number of first conductive bumps 120B may correspond to the number of connection pads 120P of semiconductor chip 120, but if desired, a greater number of first conductive bumps 120B may be provided. First conductive bump 120B may be connected to redistribution layer 142a through a first wiring via 143a1 of redistribution structure 140.

Second conductive bump 112B may electrically connect an uppermost wiring layer 112d of frame substrate 110 to redistribution layers 142a, 142b, and 142c of redistribution structure 140. Second conductive bump 112B may also be a copper pillar, but an example embodiment thereof is not limited thereto. The number of second conductive bumps 112B is not limited to any particular number, and a greater number of second conductive bumps 112B may be included depending on a design of uppermost wiring layer 112d.

Second conductive bump 112B may be connected to redistribution layer 142a through a second wiring via 143a2 of redistribution structure 140.

Insulating post 126 may be disposed in cavity 110h, and a lower surface of insulating post 126 may be directly in contact with adhesive member 125. Insulating post 126 may be spaced apart from plurality of conductive bumps 120B and 112B, and may be insulated with respect to redistribution layers 142a, 142b, and 142c of redistribution structure 140 and plurality of wiring layers 112a, 112b, 112c, and 112d of the frame substrate 110.

An upper surface of insulating post 126 may be substantially coplanar (S1) with an upper surface of encapsulant 130, an upper surface of first conductive bump 120B, and an upper surface of second conductive bump 112B. In the example embodiment, to form redistribution structure 140 on the upper surface of semiconductor chip 120 disposed to be faced up, a grinding process for planarizing the upper surface of encapsulant 130 may be necessary. The lower the total thickness variation (TTV) of a flat surface S1 formed by the grinding process, the more the reliability of redistribution structure 140 may improve, and the semiconductor package may have a uniform thickness.

Insulating post 126 may include a ceramic material having high hardness, greater than that of a metal material of first and second conductive bumps 120B and 112B and a polymer material of encapsulant 130, such as at least one of alumina ($Al_2O_3$), silicon carbide (SiC), silicon nitride (SiN), boron nitride (BN), and zirconia ($ZrO_2$), for example, such that, in a grinding process, a grinding stop line (a lower limit line) including an upper surface of insulating post 126 may be formed, and accordingly, a tolerance of a thickness of the grinding process may decrease. Also, to form the grinding stop line, insulating post 126 may have a width W1 and a cross-sectional area of surface A1 relatively greater than those of first and second conductive bumps 120B and 112B.

For example, the upper surface of insulating post 126 may form the flat surface S1 on which redistribution structure 140 is disposed, along with the upper surface of encapsulant 130, the upper surface of first conductive bump 120B, and the upper surface of second conductive bump 112B. The width W1 of insulating post 126 may be the same as or greater than a width W2 of first conductive bump 120B and a width W3 of second conductive bump 112B. When the width W2 of first conductive bump 120B is less than the width W3 of second conductive bump 112B, the width W1 of insulating post 126 may be greater than the width W2 of first conductive bump 120B, and may be the same as or greater than the width W3 of second conductive bump 112B. Also, referring to FIG. 2A, the upper surface of insulating post 126, the upper surface of first conductive bump 120B, and the upper surface of second conductive bump 112B may be exposed from the upper surface of encapsulant 130, and in this case, the size of the area of a cross-sectional surface A1 the upper surface of insulating post 126 may be the same as or greater than the size of the areas of cross-sectional surfaces A2 and A3 of first and second conductive bumps 120B and 112B. When the area of the cross-sectional surface A2 of first conductive bump 120B is less than the area of the cross-sectional surface A3 of second conductive bump 112B, the size of the area of the cross-sectional surface A1 of the upper surface of insulating post 126 may be greater than the size of the area of the cross-sectional surface A2 of first conductive bump 120B and may be the same as or greater than the size of the area of the cross-sectional surface A3 of second conductive bump 112B.

Also, as insulating post 126 may include a ceramic material having a low thermal expansion coefficient (CTE) and high thermal capacity, insulating post 126 may work as a thermal reservoir for rapid heat.

As illustrated in FIGS. 2B and 2C, in one or more example embodiments semiconductor package 100A may include a plurality of insulating posts 126 surrounding semiconductor chip 120 on adhesive member 125, differently from the example illustrated in FIG. 2A. The plurality of insulating posts 126 may be disposed symmetrically to each other with reference to semiconductor chip 120 as illustrated in FIG. 2B, or may be disposed asymmetrically as illustrated in FIG. 2C. The plurality of insulating posts 126 may increase a planar area of a high hardness material exposed in the grinding process, thereby decreasing a tolerance of a thickness of the grinding process. The number and the dispositional relationship of the plurality of insulating posts 126 are not limited to any particular examples.

As illustrated in FIGS. 3A, 3B, 3C, 3D to 3E, insulating post 126 may have a cylindrical shape, a conical shape, a polyprismatic shape, a polypyramidal shape, or a shape in which a plurality of spheres are stacked vertically. Insulating post 126 may be formed by sintering ceramic power.

Encapsulant 130 may fill cavity 110h, may cover side surfaces of first and second conductive bumps 120B and 112B and a side surface of insulating post 126, and may protect semiconductor chip 120 in cavity 110h. Encapsulant 130 may be disposed on redistribution structure 140 to enclose at least a portion of each of frame substrate 110 and semiconductor chip 120. Encapsulant 130 may include a polymer material. For example, encapsulant 130 may include a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, Ajinomoto build-up film (ABF), FR-4, bismaleimide triazine (BT), or the like. In an example embodiment, encapsulant 130 may include a photosensitive resin.

Redistribution structure 140 may redistribute connection pad 120P of semiconductor chip 120, and may electrically connect connection pad 120P to the plurality of wiring layers 112a, 112b, 112c, and 112d of frame substrate 110. Redistribution structure 140 may include one or more insulating layers 141a, 141b, and 141c disposed on encapsulant 130, redistribution layers 142a, 142b, and 142c disposed on one or more insulating layers 141a, 141b, and 141c, respectively, and electrically connected to first and second conductive bumps 120B and 112B, and redistribution vias 143a, 143b, and 143c penetrating one or more insulating layers 141a, 141b, and 141c and connecting redistribution layers 142a, 142b, and 142c to first and second conductive bumps 120B and 112B or connecting redistribution layers 142a, 142b, and 142c disposed on different levels to each other. The number of each of the insulating layers and the redistribution layers may be greater than or smaller than the examples illustrated in the diagram. The redistribution layers which are not connected to each other may be connected to each other by bypassing a region not illustrated in the diagram.

Insulating layers 141a, 141b, and 141c may include an insulating material the same as, or similar to, insulating layers 111a, 111b, and 111c of frame substrate 110. Insulating layers 141a, 141b, and 141c of redistribution structure 140 may include a photosensitive resin such as a PID resin, and in this case, each of insulating layers 141a, 141b, and 141c may have a reduced thickness, and redistribution vias 143a1, 143a2, 143b, and 143c may be finely formed. When insulating layers 141a, 141b, and 141c include multiple layers, the layers may include the same material or different materials. Also, when insulating layers 141a, 141b, and 141c include multiple layers, boundaries among insulating layers 141a, 141b, and 141c may be indistinct depending on processes.

Redistribution layers 142a, 142b, and 142c may substantially redistribute connection pad 120P, and may include a metal material including copper (Cu), aluminum (Al), silver (Ag), tin (Sn), gold (Au), nickel (Ni), lead (Pb), titanium (Ti), or alloys thereof. Redistribution layers 142a, 142b, and 142c may perform various functions depending on a respective design. For example, redistribution layers 142a, 142b, and 142c may include a ground (GND) pattern, a power (PWR) pattern, a signal (S) pattern, and the like.

Redistribution layers 142a, 142b, and 142c may electrically connect redistribution layers 142a, 142b, and 142c disposed on different levels to first and second conductive bumps 120B and 112B, thereby forming an electrical path in semiconductor package 100A. Redistribution layers 142a, 142b, and 142c may include a via for a signal, a via for ground, and a via for power. Redistribution layers 142a, 142b, and 142c may include a metal material including copper (Cu), aluminum (Al), silver (Ag), tin (Sn), gold (Au), nickel (Ni), lead (Pb), titanium (Ti), or alloys thereof. Redistribution layers 142a, 142b, and 142c may be configured as filled vias completely filled with a metal material, or may be conformal vias in which a metal material is formed along walls of via holes.

Semiconductor package 100A in the example embodiment may further include first and second passivation layers 151 and 152, under bump metals 160, and connection bumps 170.

First passivation layer 151 may be disposed on redistribution structure 140 and may protect redistribution structure 140 from external physical/chemical damage. First passivation layer 151 may have a plurality of openings 151h for exposing at least a portion of an uppermost redistribution layer 142c of redistribution structure 140. First passivation layer 151 may include an insulating material. The insulating material may include prepreg, an ABF, FR-4, BT, or a solder resist. Second passivation layer 152 may be disposed on frame substrate 110 and may protect frame substrate 110 from external physical/chemical damage. Second passivation layer 152 may include an opening 152h for exposing at least a portion of a lowermost wiring layer 112c of frame substrate 110. Second passivation layer 152 may include an insulating material the same as that of first passivation layer 151, and first passivation layer 151 and second passivation layer 152 may include the same material or different materials.

Under bump metal 160 may be disposed in each of the plurality of openings 151h of first passivation layer 151, and may be electrically connected to uppermost redistribution layer 142c. Under bump metal 160 may improve connection reliability of connection bump 170, and may improve board level reliability of the package. Under bump metal 160 may be connected to uppermost redistribution layer 142c of redistribution structure 140 exposed through opening 151h of first passivation layer 151. Under bump metal 160 may be formed by a metallization method using a metal, but an example embodiment thereof is not limited thereto.

Connection bump 170 may be disposed on under bump metal 160, and may be electrically connected to uppermost redistribution layer 142c through under bump metal 160. Connection bump 170 may connect semiconductor package 100A to an external device physically and/or electrically. Connection bump 170 may include a metal having a low melting point, such as tin (Sn) or an alloy (Sn—Ag—Cu) including tin (Sn), for example. Connection bump 170 may have a land shape, a ball shape, or a pin shape. At least one of the plurality of connection bumps 170 may be disposed in a fan-out region. A fan-out region refers to a region which does not overlap a cross-section or plan view of semiconductor chip 120.

FIGS. 4, 5, 6, 7, 8 and 9 are cross-sectional diagrams illustrating an example embodiment of a method of manufacturing the semiconductor package illustrated in FIG. 1.

Figure 4:
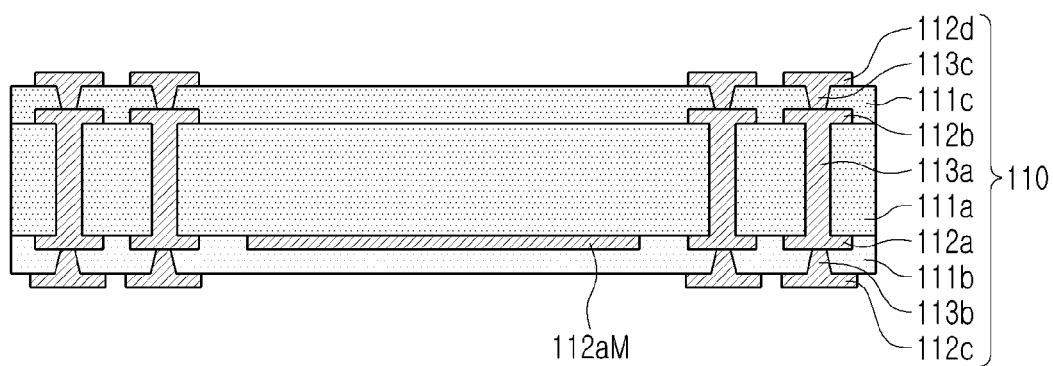
FIGS. 4, 5, 6, 7, 8 and 9 are cross-sectional diagrams illustrating an example embodiment of a method of manufacturing the semiconductor package illustrated in FIG. 1.

Referring to FIG. 4, frame substrate 110 including a plurality of insulating layers 111a, 111b, and 111c, wiring layers 112a, 112b, 112c, and 112d, wiring vias 113a, 113b, and 113c, and a stopper layer 112aM may be prepared. Frame substrate 110 may be manufactured by: forming first and second wiring layers 112a and 112b on a lower surface and an upper surface of core insulating layer 111a, respectively; forming first wiring via 113a for connecting first and second wiring layers 112a and 112b to each other, and stopper layer 112aM spaced apart from first wiring layer 112a on the lower surface of core insulating layer 111a; forming first insulating layer 111b covering first wiring layer 112a on the lower surface of core insulating layer 111a; forming second insulating layer 111c covering second wiring layer 112b on an upper surface of core insulating layer 111a; forming third wiring layer 112c disposed on first insulating layer 111b, and second wiring via 113b for connecting third wiring layer 112c to first wiring layer 112a; and forming fourth wiring layer 112d disposed on second insulating layer 111c, and third wiring via 113c for connecting fourth wiring layer 112d to second wiring layer 112b. First and second wiring layers 112a and 112b may be formed by performing a plating process on a copper clad laminate (CCL), and first wiring via 113a may be formed by forming a via hole penetrating the copper clad laminate (CCL) using a mechanical drill or a laser drill and performing a plating process. Each of first and second insulating layers 111b and 111c may be formed by laminating and curing prepreg or an ABF. Third and fourth wiring layers 112c and 112d and second and third wiring vias 113b and 113c may be formed by the above-mentioned plating process and the drilling process.

Figure 5:
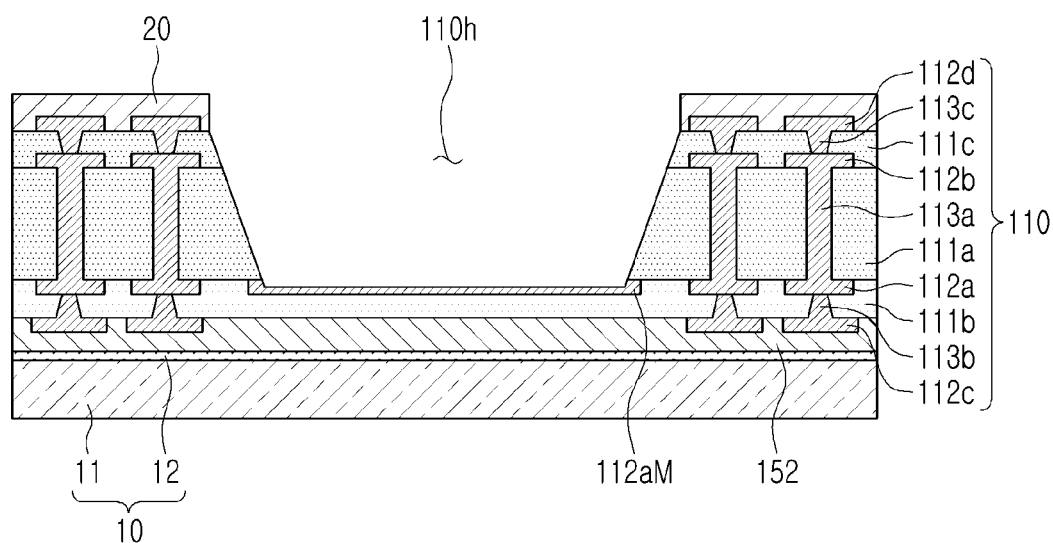

Referring to FIG. 5, cavity 110h may be formed in frame substrate 110. Second passivation layer 152 may be formed on a lower side of frame substrate 110, and a carrier film 10 including an insulating layer 11 and a metal layer 12 may be attached to a lower side of second passivation layer 152. Thereafter, a dry film 20 may be attached to an upper side of frame substrate 110, and cavity 110h penetrating second insulating layer 111c and core insulating layer 111a of frame substrate 110 may be formed to expose stopper layer 112aM. Depending on processes, second passivation layer 152 may not be provided, and a different type of carrier film 10 may be used. Cavity 110h may be formed by a sandblasting process. In this case, a side wall of cavity 110h may have a tapered cross-sectional shape, and stopper layer 112aM may work as a stopper in a sandblasting process.

Figure 6:
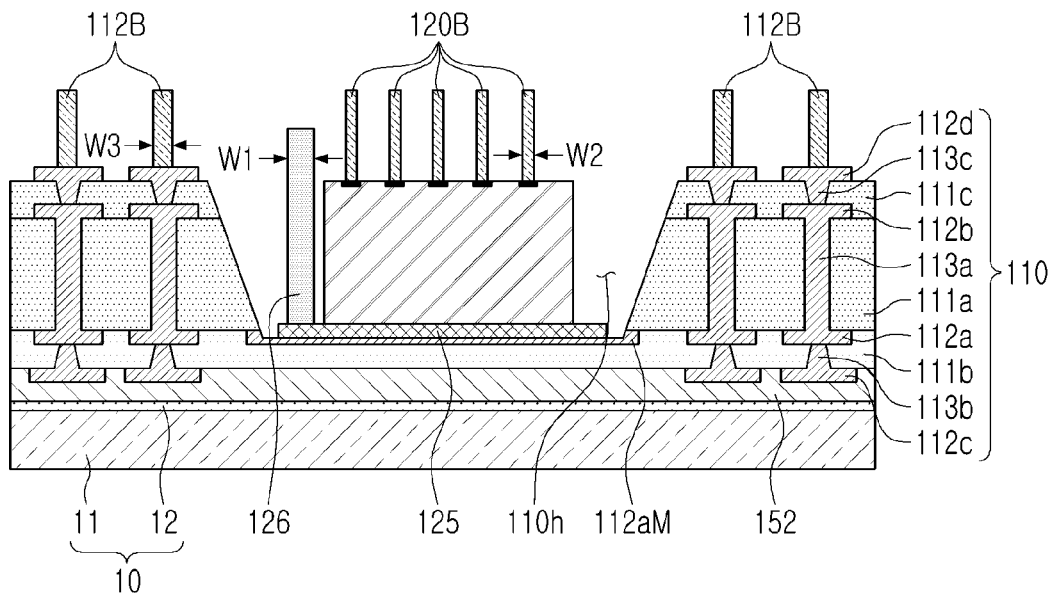

Referring to FIG. 6, semiconductor chip 120, first and second conductive bumps 120B and 112B, and insulating post 126 may be disposed on frame substrate 110. Dry film 20 (in FIG. 5) may be removed, an adhesive member 125 may be disposed on a bottom surface of cavity 110h, and semiconductor chip 120 and insulating post 126 may be formed on adhesive member 125. Also, first conductive bump 120B may be formed on connection pad 120P of semiconductor chip 120, and second conductive bump 112B may be formed on uppermost wiring layer 112d. First and second conductive bumps 120B and 112B and insulating post 126 may be formed in a die attach process for semiconductor chip 120, and an order of forming the elements is not limited to any particular example. As adhesive member 125, a die attach film (DAF) may be used. An upper surface of insulating post 126 may be disposed on a level lower than a level of each of first and second conductive bumps 120B and 112B. First and second conductive bumps 120B and 112B may be formed by attaching a copper pillar, or directly forming a copper pillar, on connection pad 120P or uppermost wiring layer 112d. Insulating post 126 may be formed by attaching a prepared ceramic sintered body on adhesive member 125. A width W1 of insulating post 126 may be greater than each of widths W2 and W3 of first and second conductive bumps 120B and 112B.

Figure 7:
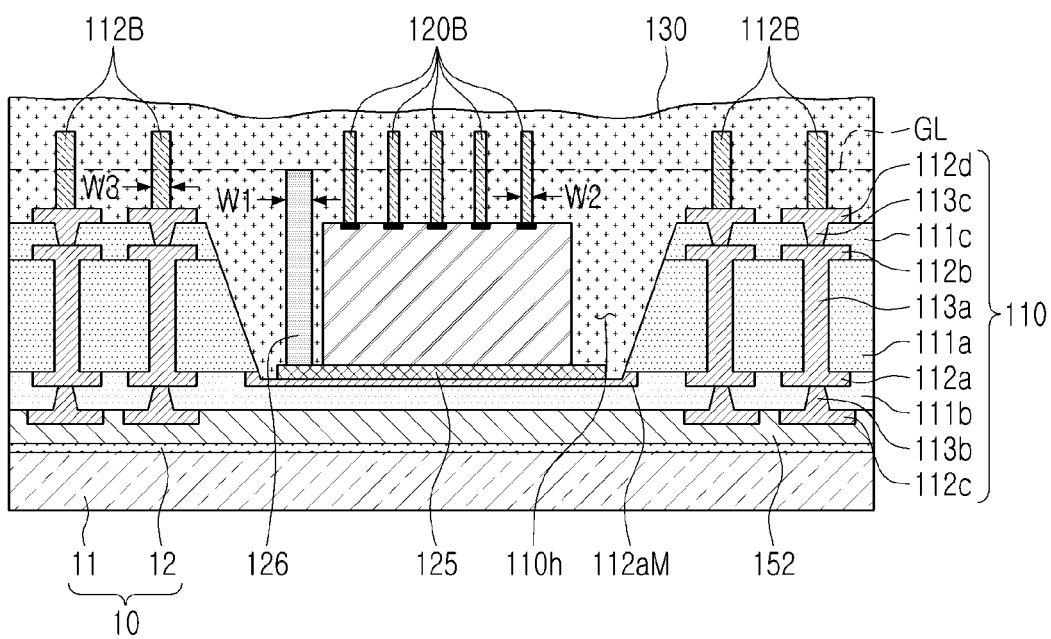

Referring to FIG. 7, encapsulant 130 may be formed on frame substrate 110. Encapsulant 130 may be formed by laminating and curing an ABF. Encapsulant 130 may be configured to cover both first and second conductive bumps 120B and 112B and insulating post 126, and an upper surface of encapsulant 130 may not be planarized by a shape of frame substrate 110 or other elements. When the non-uniform upper surface of encapsulant 130 is ground, a thickness tolerance may be present along a curvature of the upper surface of initial encapsulant 130 even after the grinding process. To address the issue of a thickness tolerance occurring in the grinding process, an upper surface of insulating post 126 may be substantially coplanar with a conceptual grinding line (GL) disposed on a product design.

Figure 8:
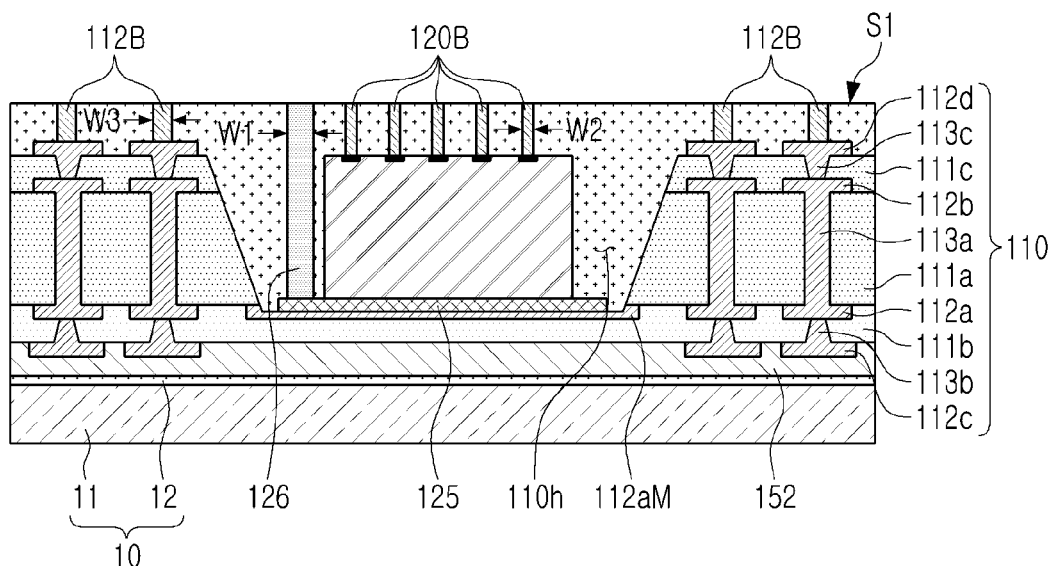

Referring to FIG. 8, a planarized grinding surface S1 may be formed by grinding an upper portion of encapsulant 130 and upper portions of first and second conductive bumps 120B and 112B. The grinding surface S1 may include upper surfaces of the plurality of conductive bumps 120B and 112B, an upper surface of insulating post 126, and an upper surface of encapsulant 130. As a lower limit line of the grinding surface S1 is maintained by insulating post 126, a total thickness variation of the grinding surface S1 may be improved compared to a case where insulating post 126 is not formed. For example, the grinding surface S1 may have a total thickness variation (TTV) of about 5 μm or lower. The size of the cross-sectional area of the upper surface of the insulating post may be the same as or greater than the size of the cross-sectional area of the upper surface of each of the plurality of conductive bumps in a direction perpendicular to the grinding surface S1.

Figure 9:
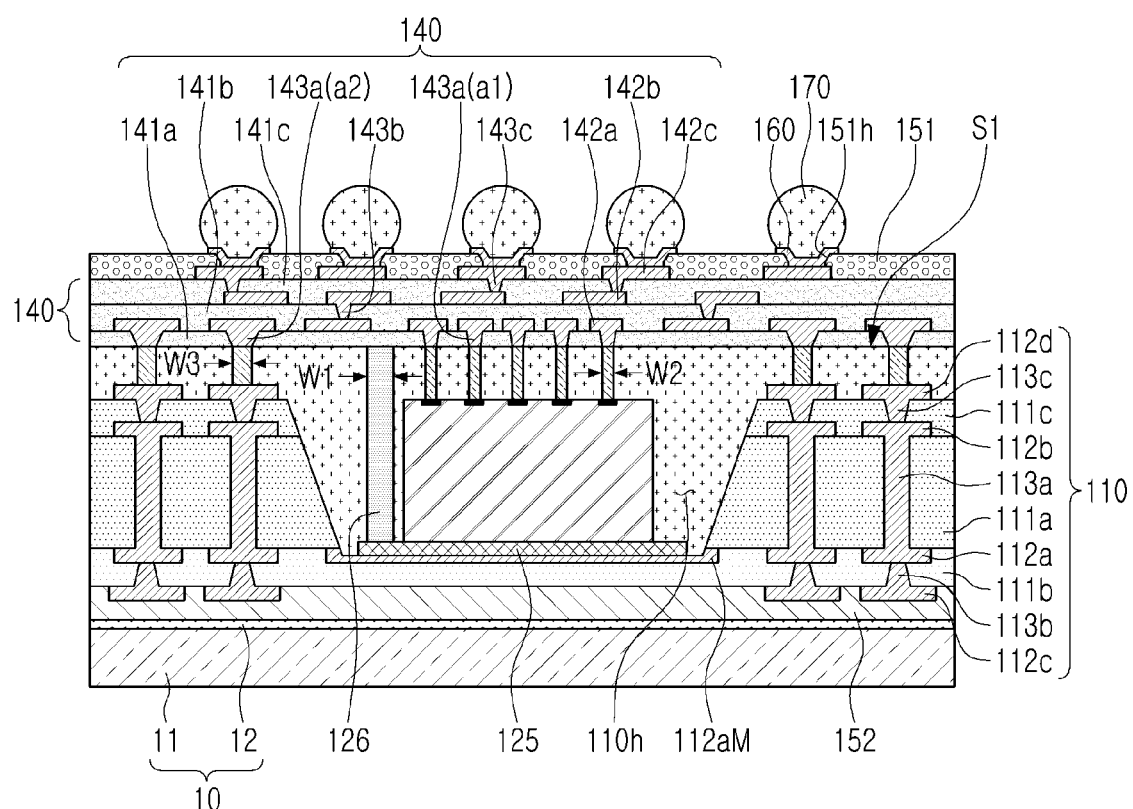

Referring to FIG. 9, redistribution structure 140 may be formed on encapsulant 130. First insulating layer 141a may be formed on encapsulant 130, and then redistribution layer 142a and redistribution vias 143a1 and 143a2 may be formed. Thereafter, second and third insulating layers 141b and 141c, second and third redistribution layers 142b and 142c, and second and third redistribution vias 143b and 143c may be formed in order. The number of each of the insulating layers and the redistribution layers may be greater than the examples illustrated in the diagram depending on a design. Thereafter, first passivation layer 151 may be formed on redistribution structure 140, and under bump metal 160 and connection bump 170 may be formed. First to third insulating layers 141a, 141b, and 141c may be formed by coating and curing a photosensitive resin (PID), and first to third redistribution layers 142a, 142b, and 142c and first to third redistribution vias 143a, 143b, and 143c may be formed by a plating process. First to third redistribution vias 143a, 143b, and 143c may be formed by plating via holes formed by a photolithography process with a conductive material. First passivation layer 151 may be formed by laminating and curing an ABF. Under bump metal 160 may be formed by a metallization method using a metal material, and connection bump 170 may be formed by a reflow process. Thereafter, carrier film 10 may be removed, and an opening may be formed in second passivation layer 152, for example beneath a portion of a lowermost wiring layer 112c, thereby manufacturing semiconductor package 100A illustrated in FIG. 1.

Figure 10:
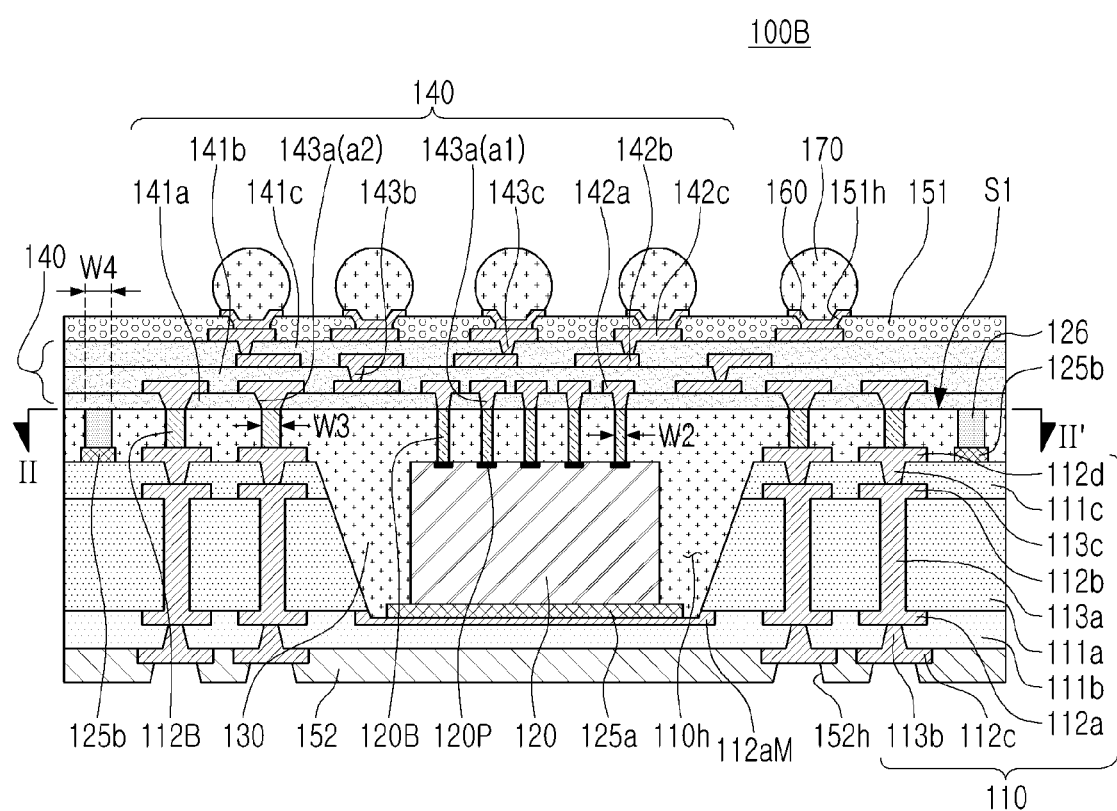
FIG. 10 is a cross-sectional diagram illustrating a semiconductor package according to another example embodiment.
Figure 11A:
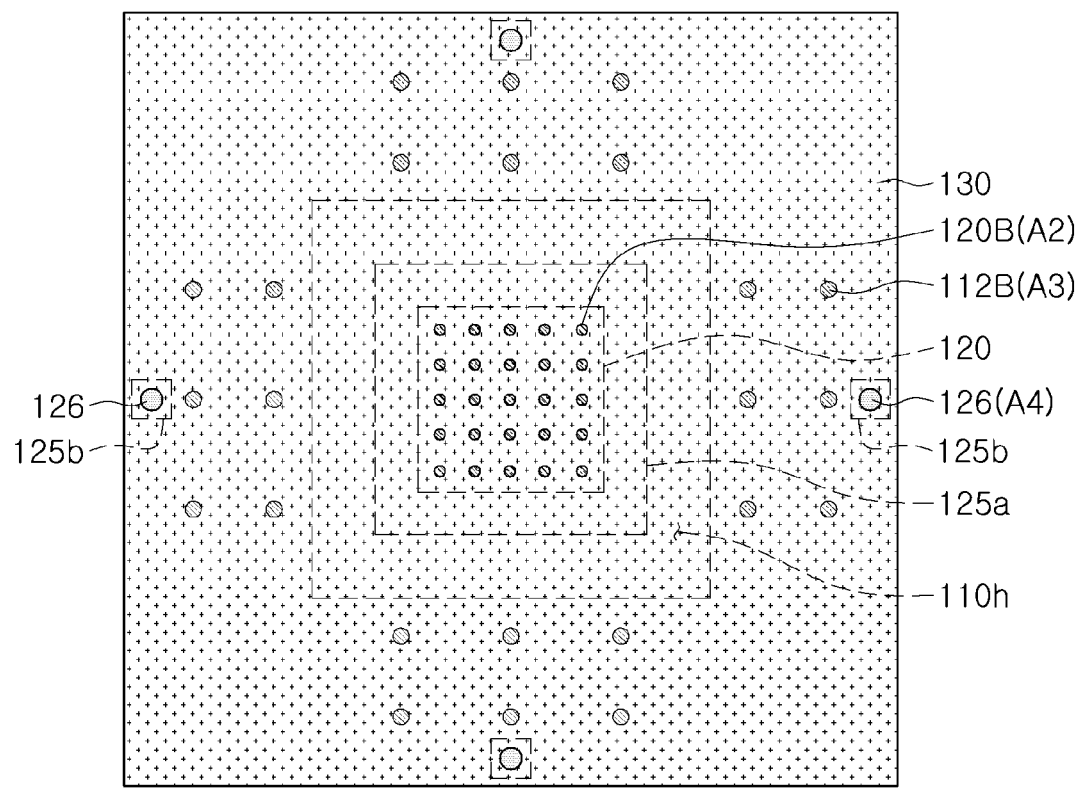
FIG. 11A is a plan diagram illustrating a cross-sectional surface of the semiconductor package illustrated in FIG. 10 along line II-II'.

FIG. 10 is a cross-sectional diagram illustrating a semiconductor package 100B according to another example embodiment. FIG. 11A is a plan diagram illustrating a cross-sectional surface of the semiconductor package illustrated in FIG. 10 along line FIG. 11B is a plan diagram illustrating a modified dispositional structure of insulating post 126 illustrated in FIG. 11A.

Referring to FIG. 10, semiconductor package 100B in the example embodiment may include insulating post 126 disposed on an adhesive member 125b on frame substrate 110. In the example embodiment, insulating post 126 may be directly disposed on a second adhesive member 125b disposed on an upper surface of frame substrate 110, rather than on a first adhesive member 125a to which a semiconductor chip 120 is attached. In this case, a plurality of the insulating posts 126 each having a relatively low height may be disposed such that process efficiency may improve. An upper surface of second adhesive member 125b may be disposed on a level the same as or higher than a level of an upper surface of a semiconductor chip 120. Second adhesive member 125b may include an adhesive resin, and a die attach film (DAF) the same as that of first adhesive member 125a may be used. A width W4 of insulating posts 126 may be the same as or greater than widths W2 and W3 of first and second conductive bumps 120B and 112B. For example, when the width W2 of first conductive bump 120B is less than the width W3 of second conductive bump 112B, a width W4 of insulating post 126 may be greater than the width W2 of first conductive bump 120B, and may be the same as or greater than the width W3 of second conductive bump 112B.

Figure 11B:
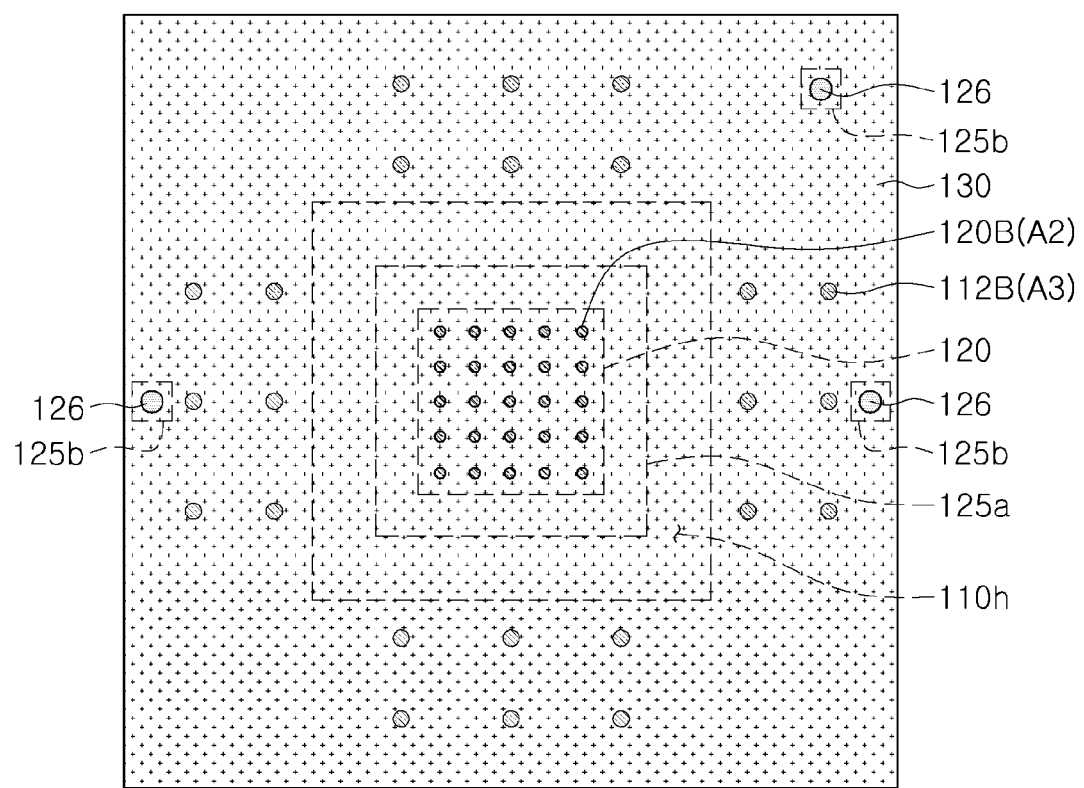
FIG. 11B is a plan diagram illustrating a modified dispositional structure of an insulating post illustrated in FIG. 11A.

Referring to FIGS. 11A and 11B, the plurality of insulating posts 126 may surround a cross-section or plan view of cavity 110h. In the diagram, the plurality of insulating posts 126 are disposed in a region outside of a region in which second conductive bumps 112B is disposed, but embodiments are not limited thereto. For example, plurality of insulating posts 126 may be disposed between second conductive bumps 112B, or may be disposed more adjacent to cavity 110h than second conductive bumps 112B. Also, as illustrated in FIG. 11B, the plurality of insulating posts 126 may be disposed asymmetrically with reference to cavity 110h.

Among the elements illustrated in FIGS. 10 to 11B, the elements denoted by the same reference numbers as in FIG. 1 may have the same technical features as those of the same elements illustrated in FIG. 1, and thus, the descriptions thereof will not be provided.

Figure 12:
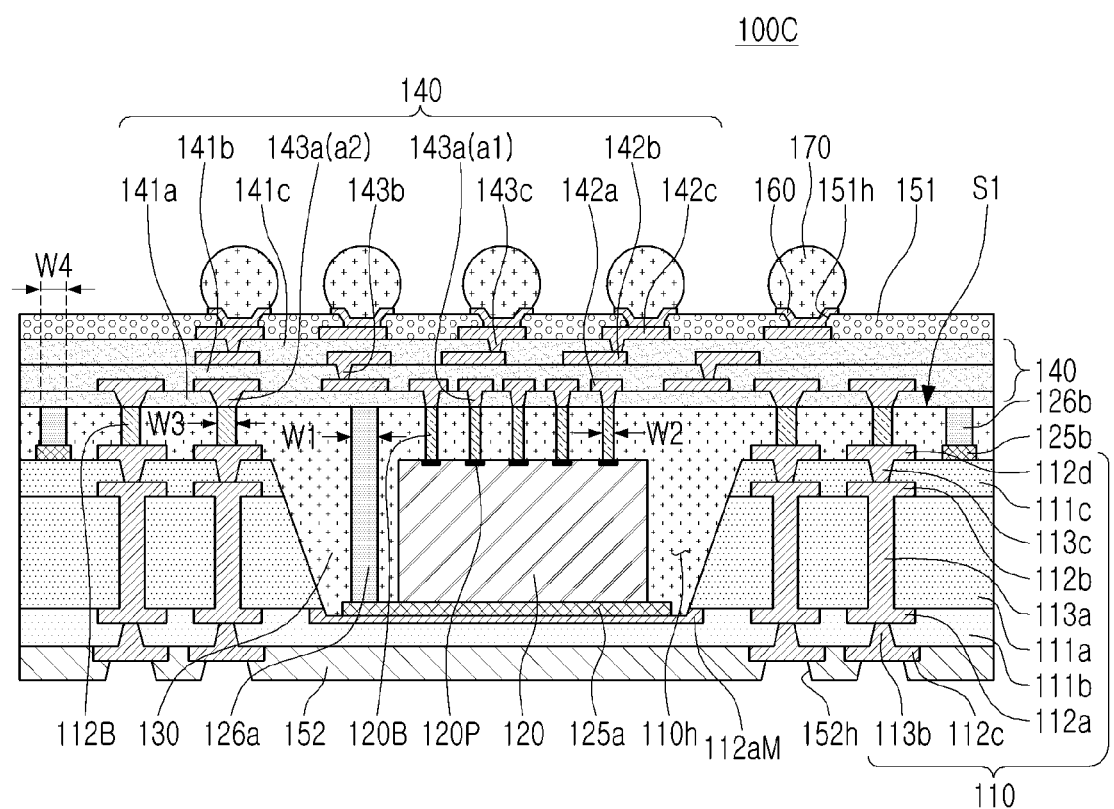
FIG. 12 is a cross-sectional diagram illustrating a semiconductor package according to another example embodiment of the present disclosure.

FIG. 12 is a cross-sectional diagram illustrating a semiconductor package 100C according to another example embodiment.

Referring to FIG. 12, semiconductor package 100C in the example embodiment may include both first insulating post 126a disposed on first adhesive member 125a disposed on a lower side of a cavity 110h and second insulating post 126b disposed on second adhesive member 125b. A semiconductor chip 120 may be disposed on first adhesive member 125a along with first insulating post 126a. First adhesive member 125*a* and second adhesive member 125*b* may be formed of the same material. A width W1 of first insulating post 126*a* may be the same as a width W4 of second insulating post 126*b*. The width W1 of first insulating post 126*a* and the width W4 of second insulating post 126*b* may be the same as or greater than each of widths W2 and W3 of first and second conductive bumps 120B and 112B. When the width W2 of first conductive bump 120B is less than the width W3 of second conductive bump 112B, the W1 of first insulating post 126*a* and the width W4 of second insulating post 126*b* may be the same as or greater than the width W3 of second conductive bump 112B.

Among the elements illustrated in FIG. 12, the elements denoted by the same reference numbers as in FIG. 1 may have the same technical features as those of the same elements illustrated in FIG. 1, and thus, the descriptions thereof will not be provided.

Figure 13:
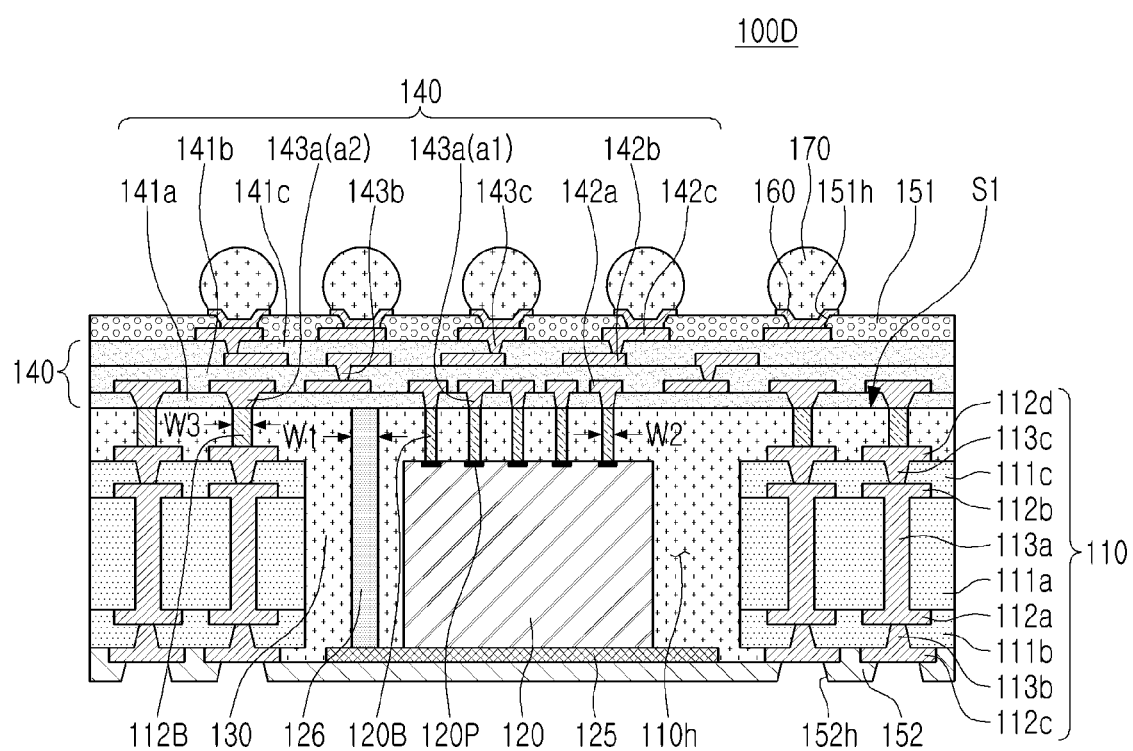
FIG. 13 is a cross-sectional diagram illustrating a semiconductor package according to another example embodiment of the present disclosure.

FIG. 13 is a cross-sectional diagram illustrating a semiconductor package 100D according to another example embodiment.

Referring to FIG. 13, semiconductor package 100D in the example embodiment may have cavity 110*h* having a structure different from the example illustrated in FIG. 1. In the example embodiment, cavity 110*h* may be configured as a through-hole completely penetrating a frame substrate 110, and a bottom side of cavity 110*h* may be blocked by passivation layer 152 covering at least a portion of lowermost wiring layer 112*c* of a plurality of wiring layers 112*a*, 112*b*, 112*c*, and 112*d*. Adhesive member 125 in contact with passivation layer 152 may be disposed on a lower side of cavity 110*h*, and semiconductor chip 120 and an insulating post 126 may be disposed on adhesive member 125. A lower surface of adhesive member 125 may be substantially coplanar with a lower surface of lowermost wiring layer 112*c* and a lower surface of encapsulant 130. When semiconductor chip 120 may be disposed in a through-hole completely penetrating frame substrate 110, a yield in an alignment process of semiconductor chip 120 may increase.

Among the elements illustrated in FIG. 13, the elements denoted by the same reference numbers as in FIG. 1 may have the same technical features as those of the same elements illustrated in FIG. 1, and thus, the descriptions thereof will not be provided.

Figure 14:
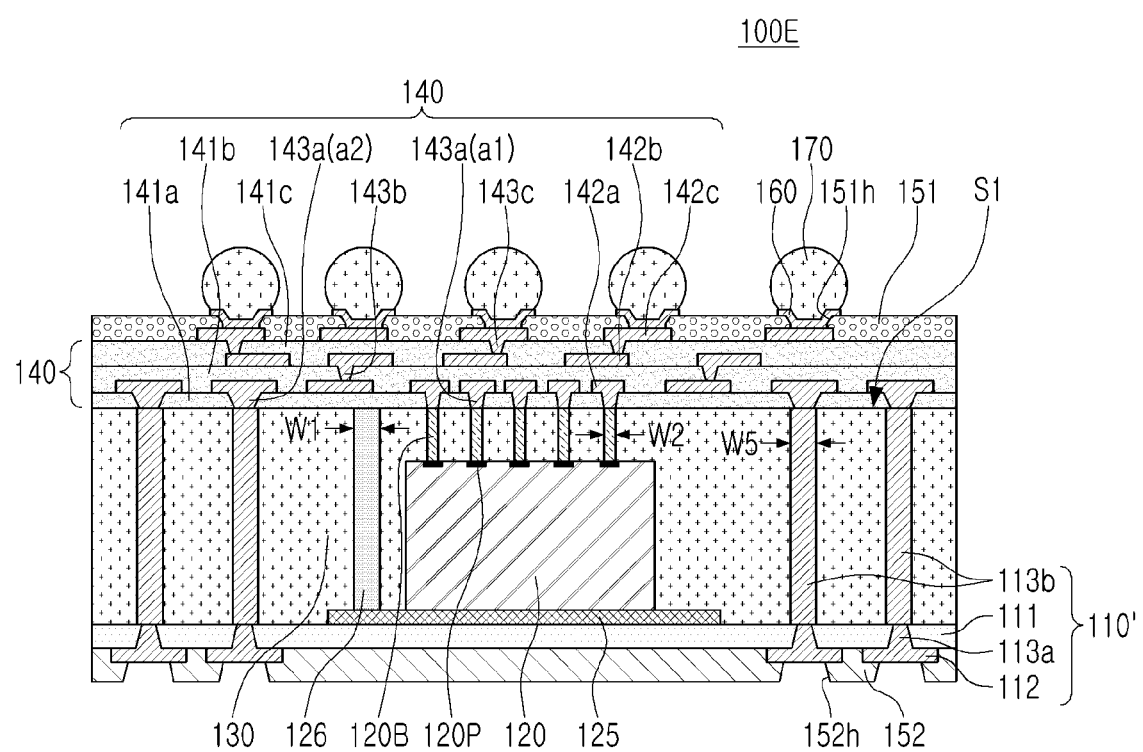
FIG. 14 is a cross-sectional diagram illustrating a semiconductor package according to another example embodiment of the present disclosure.

FIG. 14 is a cross-sectional diagram illustrating a semiconductor package 100E according to another example embodiment.

Referring to FIG. 14, semiconductor package 100E in the example embodiment may include semiconductor chip 120 including conductive bump 120B disposed on connection pad 120P, first redistribution structure 140 including first redistribution layers 142*a*, 142*b*, and 142*c*, a second redistribution structure 110' including a second redistribution layer 112 and a vertical connection conductor 113*b*, insulating post 126, and encapsulant 130.

Insulating post 126 may be disposed on adhesive member 125 along with semiconductor chip 120, and a lower surface of adhesive member 125 may be substantially coplanar with a lower surface of encapsulant 130 and a lower surface of vertical connection conductor 113*b*. An upper surface of insulating post 126 may be substantially coplanar with an upper surface of conductive bump 120B and an upper surface of vertical connection conductor 113*b*. Insulating post 126 may be disposed between first redistribution structure 140 and second redistribution structure 110' and may be insulated with respect to first redistribution layer 142 and second redistribution layer 112.

Second redistribution structure 110' may include an insulating layer 111 disposed on a lower side of semiconductor chip 120, second redistribution layer 112 disposed on insulating layer 111, vertical connection conductor 113*b* penetrating encapsulant 130 and electrically connecting first redistribution layer 142 to second redistribution layer 112, and a through-via 113*a* penetrating insulating layer 111 and connecting second redistribution layer 112 to vertical connection conductor 113*b*. Vertical connection conductor 113*b* may be configured as a conductive post penetrating encapsulant 130, and may provide a vertical connection path in semiconductor package 100E. Second redistribution structure 110' may provide a redistribution layer on a rear surface of semiconductor chip 120.

Among the elements illustrated in FIG. 14, the elements denoted by the same reference numbers as in FIG. 1 may have the same technical features as those of the same elements illustrated in FIG. 1, and thus, the descriptions thereof will not be provided.

Figure 15:
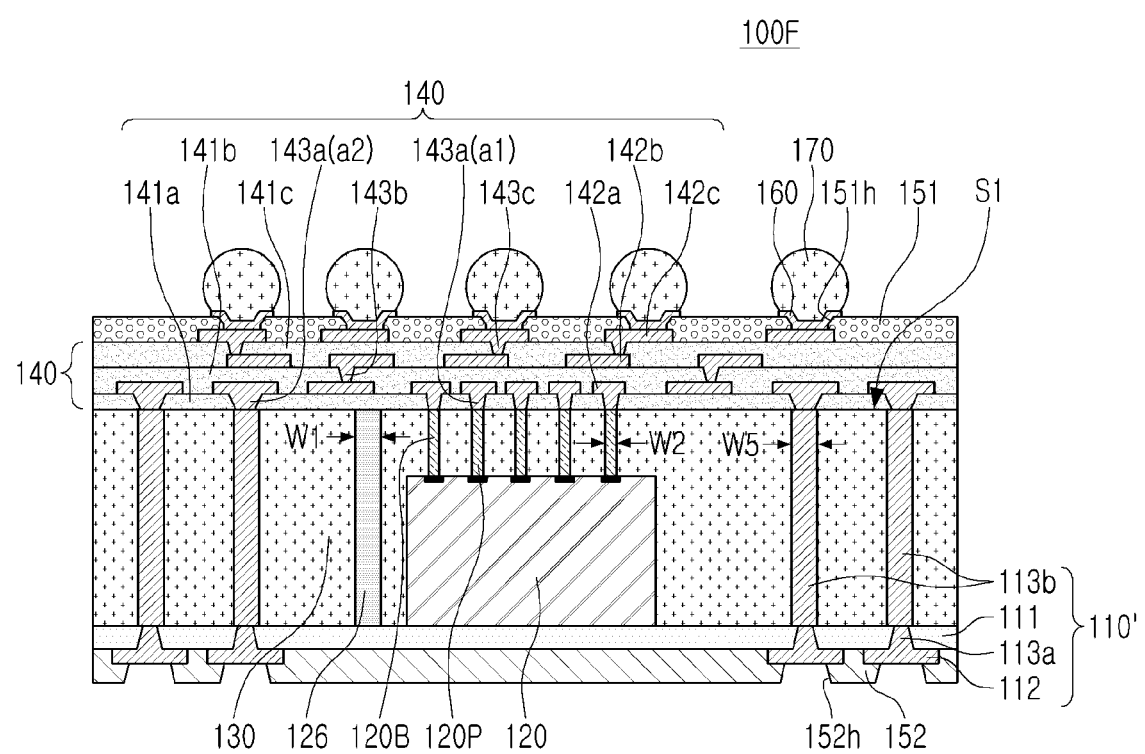
FIG. 15 is a cross-sectional diagram illustrating a semiconductor package according to another example embodiment of the present disclosure.

FIG. 15 is a cross-sectional diagram illustrating a semiconductor package 100F according to another example embodiment.

Referring to FIG. 15, semiconductor package 100F in the example embodiment may not include the adhesive member 125 (in FIG. 14), differently from semiconductor package 100E illustrated in FIG. 14. Accordingly, a lower surface of semiconductor chip 120 may be directly in contact with insulating layer 111 of second redistribution structure 110', and a lower surface of insulating post 126 may be coplanar with a lower surface of encapsulant 130, a lower surface of vertical connection conductor 113*b*, and a lower surface of semiconductor chip 120.

Among the elements illustrated in FIG. 15, the elements denoted by the same reference numbers as in FIG. 1 may have the same technical features as those of the same elements illustrated in FIG. 1, and thus, the descriptions thereof will not be provided.

Figure 16:
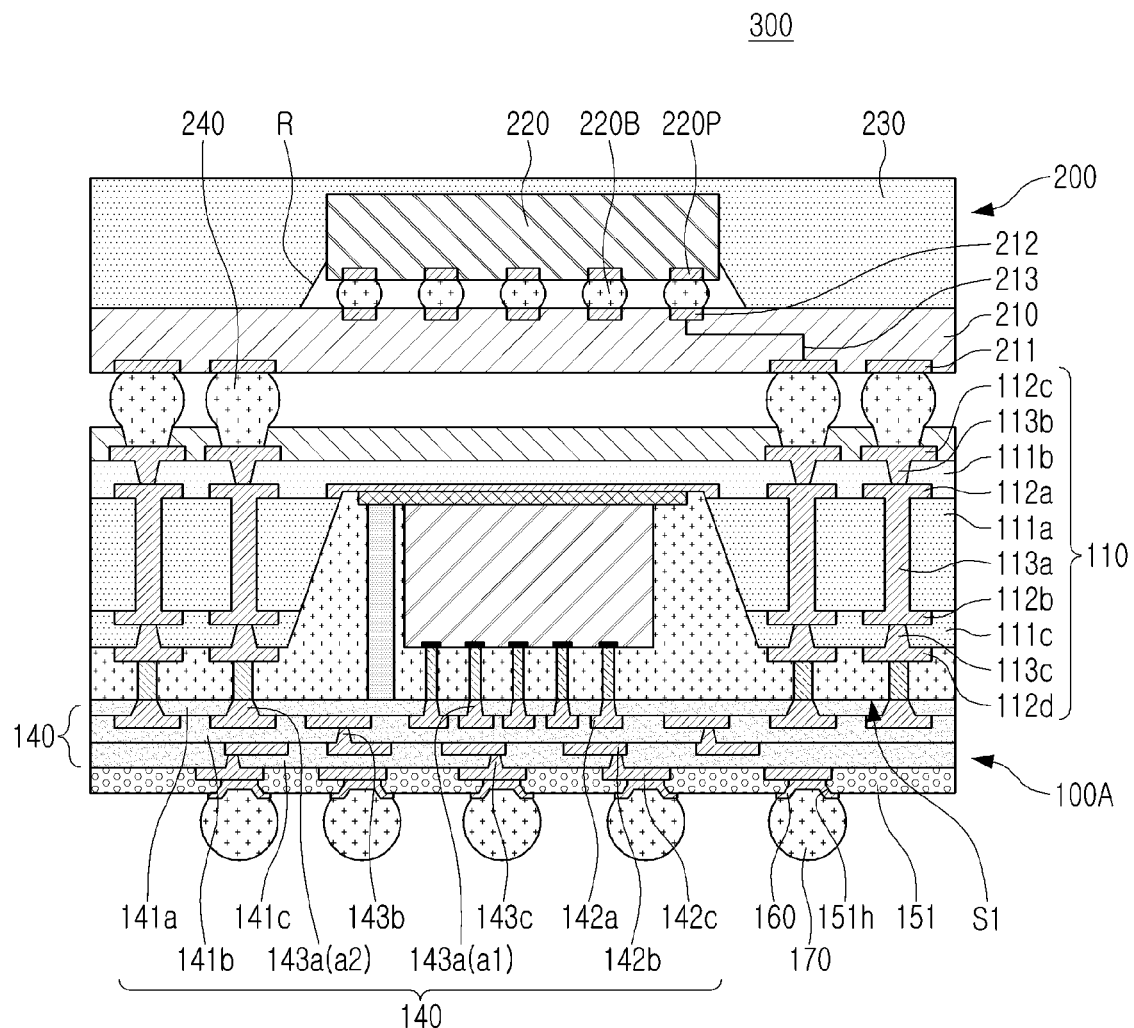
FIG. 16 is a cross-sectional diagram illustrating a semiconductor package according to another example embodiment of the present disclosure.

FIG. 16 is a cross-sectional diagram illustrating a semiconductor package 300 according to another example embodiment.

Referring to FIG. 16, semiconductor package 300 may have an on-package structure in which a second semiconductor package 200 is disposed on and combined with first semiconductor package 100A. Second semiconductor package 200 may include a redistribution member 210, a semiconductor chip 220, and an encapsulant 230. First semiconductor package 100A may be replaced with the semiconductor package described in the aforementioned example embodiments.

Redistribution member 210 may include redistribution pads 211 and 212 electrically connected to an external entity on a lower surface and an upper surface thereof, and may include a redistribution pattern 213 connected to redistribution pads 211 and 212 therein. Redistribution pattern 213 may redistribute a connection pad 220P of semiconductor chip 220.

Semiconductor chip 220 may include connection pad 220P connected to an integrated circuit disposed therein, and connection pad 220P may be electrically connected to redistribution member 210 by a metal connection bump 220B. In an example embodiment, second semiconductor package 200 may further include an underfill material R enclosing metal connection bump 220B. The underfill material R may be an insulating material including an epoxy resin, or the like. Metal connection bump 220B may include a solder ball or a copper pillar. Differently from the example illustrated in the diagram, in an example embodiment, connection pad 220P of semiconductor chip 220 may be directly in contact with an upper surface of redistribution member 210, and may be electrically connected to redistribution pattern 213 through a via formed in redistribution member 210.

Encapculant member 230 may include a material the same as or similar to encapsulant 130 of semiconductor package 100A.

Second semiconductor package 200 may be physically/electrically connected to semiconductor package 100A by a connection bump 240. Connection bump 240 may be electrically connected to redistribution pattern 213 disposed in redistribution member 210 through redistribution pad 211 disposed on a lower surface of redistribution member 210, or may be electrically connected to redistribution patterns through an underbump metal disposed on redistribution pad 211 disposed on a lower surface of redistribution member 210. Connection bump 240 may be formed of a metal having a low melting point, such as tin (Sn) or an alloy including tin (Sn).

Among the elements illustrated in FIG. 16, the elements denoted by the same reference numbers as in FIG. 1 may have the same technical features as those of the same elements illustrated in FIG. 1, and thus, the descriptions thereof will not be provided.

According to the aforementioned example embodiments, by reducing a thickness deviation in a grinding process by including a structure including a material having a high degree of hardness, a semiconductor package including a redistribution layer with improved reliability, and having a uniform thickness may be provided.

While the example embodiments have been shown and described above, it will be apparent to those skilled in the art that modifications and variations could be made without departing from the scope of the present inventive concept as defined by the appended claims.

What is claimed is:

1. A semiconductor package, comprising:
   a frame substrate including a plurality of wiring layers disposed on different levels, and having a cavity including a stopper layer disposed at a bottom surface of the cavity;
   an adhesive member disposed on the bottom surface of the cavity;
   a semiconductor chip disposed in the cavity, and having an upper surface on which a connection pad is disposed and a lower surface opposing the upper surface, where the lower surface is in contact with the adhesive member;
   a first conductive bump disposed on the connection pad;
   a second conductive bump disposed on an uppermost wiring layer of the plurality of wiring layers;
   an insulating post disposed in the cavity, and having a lower surface in contact with the adhesive member, and having side surfaces spaced apart from side walls of the frame substrate within the cavity;
   an encapsulant filling the cavity and covering side surfaces of the first and second conductive bumps and the side surfaces of the insulating post; and
   a redistribution structure disposed on the encapsulant, wherein the redistribution structure includes a redistribution layer electrically connected to the first and second conductive bumps,
   wherein the insulating post includes a material having a greater hardness than that of the first and second conductive bumps.

2. The semiconductor package of claim 1, wherein an upper surface of the insulating post is substantially coplanar with an upper surface of the encapsulant, an upper surface of the first conductive bump, and an upper surface of the second conductive bump.

3. The semiconductor package of claim 2, wherein a size of a cross-sectional area of the upper surface of the insulating post is the same as or greater than a size of a cross-sectional area of the upper surface of the first conductive bump and also greater than a size of a cross-sectional area of the upper surface of the second conductive bump.

4. The semiconductor package of claim 1, wherein the redistribution structure further comprises:
   an insulating layer having an upper surface, wherein the redistribution layer is disposed on the upper surface of the insulating layer, and
   a redistribution via penetrating the insulating layer and connecting the redistribution layer to the first and second conductive bumps, and
   wherein the insulating layer includes a photosensitive resin.

5. The semiconductor package of claim 1, wherein the insulating post is insulated with respect to the redistribution layer and the plurality of wiring layers.

6. The semiconductor package of claim 1, wherein the first and second conductive bumps include a metal material,
   wherein the insulating post includes a ceramic material, and
   wherein the encapsulant includes a polymer material.

7. The semiconductor package of claim 6, wherein the ceramic material includes at least one of alumina ($Al_2O_3$), silicon carbide (SiC), silicon nitride (SiN), boron nitride (BN), and zirconia ($ZrO_2$).

8. The semiconductor package of claim 1, wherein the frame substrate further includes a core insulating layer, a first insulating layer disposed at a lower surface of the core insulating layer, and a second insulating layer disposed on an upper surface of the core insulating layer,
   wherein the plurality of wiring layers include a first wiring layer disposed at the lower surface of the core insulating layer and covered by the first insulating layer, a second wiring layer disposed on the upper surface of the core insulating layer and covered by the second insulating layer, a third wiring layer disposed at a lower surface of the first insulating layer, and a fourth wiring layer disposed on an upper surface of the second insulating layer,
   wherein the cavity penetrates the second insulating layer and the core insulating layer, and
   wherein the first insulating layer covers a lower surface of the stopper layer.

9. The semiconductor package of claim 8, wherein the third wiring layer is disposed on a lower level than a level of the stopper layer.

10. The semiconductor package of claim 1, further comprising:
    a first passivation layer covering the redistribution layer on the redistribution structure, and having a plurality of openings therethrough to at least a portion of the redistribution layer;
    a plurality of under bump metals disposed in the plurality of openings, respectively, and electrically connected to the redistribution layer; and
    a plurality of connection bumps disposed on the plurality of under bump metals, respectively,
    wherein at least a portion of the plurality of connection bumps is disposed in a region which does not overlap the semiconductor chip in a direction perpendicular to the upper surface of the semiconductor chip.

11. A semiconductor package, comprising:
a frame substrate including a plurality of wiring layers disposed on different levels, and having a cavity;
a semiconductor chip disposed in the cavity, and having an upper surface on which a connection pad is disposed and a lower surface opposing the upper surface, wherein the lower surface faces a bottom of the cavity;
a plurality of conductive bumps disposed on an uppermost wiring layer of the plurality of wiring layers and on the connection pad, respectively;
an insulating post disposed on the frame substrate and spaced apart from the plurality of conductive bumps;
an encapsulant filling the cavity and covering side surfaces of the plurality of conductive bumps and a side surface of the insulating post; and
a redistribution structure comprising
an insulating layer disposed on the encapsulant, and
a redistribution layer disposed on the insulating layer and connected to the plurality of conductive bumps,
wherein the insulating post includes a material different from a material of the plurality of conductive bumps, and
wherein an upper surface of the insulating post is substantially coplanar with an upper surface of the encapsulant.

12. The semiconductor package of claim 11, further comprising:
an adhesive member disposed on a lower side of the cavity,
wherein a lower surface of the insulating post and the lower surface of the semiconductor chip are directly in contact with an upper surface of the adhesive member.

13. The semiconductor package of claim 11, further comprising:
an adhesive member disposed on an upper surface of the frame substrate,
wherein a lower surface of the insulating post is directly in contact with an upper surface of the adhesive member, and
wherein an upper surface of the adhesive member is disposed on a level the same as or higher than a level of the upper surface of the semiconductor chip.

14. The semiconductor package of claim 11,
wherein the cavity penetrates a portion of the frame substrate, and
wherein a stopper layer is disposed on a bottom surface of the cavity.

15. The semiconductor package of claim 11,
wherein the cavity completely penetrates the frame substrate, and
wherein the bottom of the cavity is disposed adjacent to a passivation layer covering at least a portion of a lowermost wiring layer of the plurality of wiring layers.

16. The semiconductor package of claim 11,
wherein the semiconductor package has a grinding surface including upper surfaces of the plurality of conductive bumps, the upper surface of the insulating post, and the upper surface of the encapsulant, and
wherein the grinding surface has a total thickness variation (TTV) value of 5 µm or lower.

17. The semiconductor package of claim 16, wherein a size of a cross-section of the upper surface of the insulating post is the same as or greater than a size of the cross-section of the upper surface of each of the plurality of conductive bumps, in a direction perpendicular to the grinding surface.

18. A semiconductor package having a top and a bottom, comprising:
a semiconductor chip disposed within the semiconductor package between the top of the semiconductor package and the bottom of the semiconductor package, wherein the semiconductor chip has a top surface, a bottom surface, and side surfaces extending between the top surface and the bottom surface, wherein the semiconductor chip includes at least one connection pad disposed on the top surface thereof;
a plurality of wiring layers stacked vertically between the top of the semiconductor package and the bottom of the semiconductor package;
a first conductive bump disposed on top of the connection pad of the semiconductor chip;
a second conductive bump disposed on top of an uppermost wiring layer among the plurality of wiring layers;
an insulating post disposed between the top of the semiconductor package and the bottom of the semiconductor package;
an encapsulant disposed at side surfaces of the first and second conductive bumps and the insulating post, and further disposed at the side surfaces of the semiconductor chip and at least a portion of the top surface of the semiconductor chip; and
a redistribution structure disposed on top of the encapsulant, wherein the redistribution structure includes a redistribution layer electrically connected to the first and second conductive bumps,
wherein a top surface of the insulating post is substantially coplanar with a top surface of the first conductive bump, a top surface of the second conductive bump, and a top surface of the encapsulant, and
wherein the insulating post is made of a material having a greater hardness than a first material of the first conductive bump and a second material of the second conductive bump.

19. The semiconductor package of claim 18, further comprising:
a stopper layer disposed beneath the bottom surface of the semiconductor chip; and
an adhesive layer disposed between the bottom surface of the semiconductor chip and the stopper layer,
wherein the bottom surface of the semiconductor chip is directly in contact with the adhesive layer, and
wherein the insulating post is disposed on top of the adhesive layer, and a bottom surface of the insulating post is directly in contact with the adhesive layer.

20. The semiconductor package of claim 18, further comprising:
a plurality of insulating layers configured to insulate the wiring layers; and
a first adhesive layer disposed on an uppermost insulating layer among the plurality of insulating layers,
wherein the insulating post is disposed on top of the first adhesive layer, and a bottom surface of the insulating post is directly in contact with the first adhesive layer.

* * * * *